(12) United States Patent  (10) Patent No.: US 7,659,757 B2
Sleigh et al.  (45) Date of Patent: Feb. 9, 2010

(54) GLITCH-FREE CLOCK REGENERATION CIRCUIT

(75) Inventors: Todd Sleigh, Kanata (CA); Steve Driediger, Kanata (CA)

(73) Assignee: Alcatel Lucent, Paris (FR)

( * ) Notice: Subject to any disclaimer, the term of this patent is extended or adjusted under 35 U.S.C. 154(b) by 91 days.

(21) Appl. No.: 11/711,682

(22) Filed: Feb. 28, 2007

(65) Prior Publication Data

US 2008/0204090 A1  Aug. 28, 2008

(51) Int. Cl.
*H03L 7/00* (2006.01)
(52) U.S. Cl. .................. 327/141; 327/144; 327/146
(58) Field of Classification Search .............. None
See application file for complete search history.

(56) References Cited

U.S. PATENT DOCUMENTS 6,222,392 B1 * 4/2001 Guo et al. ................ 327/20
6,310,653 B1 * 10/2001 Malcolm et al. ............ 348/537
2008/0116964 A1 * 5/2008 Kernahan et al. ........... 327/538

* cited by examiner

*Primary Examiner*—Tuan Lam
*Assistant Examiner*—Hiep Nguyen
(74) *Attorney, Agent, or Firm*—Kramer & Amado, P.C.

(57) ABSTRACT

A clock regeneration circuit and method including an asynchronous clock signal input to a meta-stability filtering circuit, a synchronous clock signal input to the meta-stability filtering circuit with a frequency lower than the asynchronous clock signal, and being over-sampled and rate adapted to the asynchronous clock signal, an edge detector detecting an edge of the output of the meta-stability filtering circuit, a regenerated clock signal output therefrom, and a clock regeneration stage receiving an input that is the edge-detected output.

17 Claims, 3 Drawing Sheets

100

GLITCH-FREE CLOCK REGENERATION CIRCUIT

BACKGROUND OF THE INVENTION

1. Field of the Invention

This invention relates generally to a circuit and method for using a stable asynchronous clock source to perform glitch-free regeneration of a clock for a synchronous interface that is not free from glitches.

2. Description of Related Art

The fields of application specific integrated circuits (ASIC) using field programmable gate arrays (FPGA), the design of such circuits, synchronous interfaces between circuit boards, telecommunications, and digital subscriber line access multiplexers (DSLAM), including redundant DSLAMs, are known. Likewise, the use of network termination (NT) cards and Utopia level two (L2) interfaces between two redundant NT cards is similarly known.

One known use for standard Utopia L2 interfaces between two redundant NT cards is to pass asynchronous transfer mode (ATM) traffic between two redundant NT cards. Such systems establish a synchronous interface between the two redundant NT cards. An example of such a system is an NT card redundant internet protocol (IP)/ATM DSLAM. Using the example of the foregoing systems, it is desirable to incorporate a glitch free clock regenerator.

Any of the foregoing objects and advantages are illustrative of those that can be achieved by various exemplary embodiments. They are not intended to be interpreted as required of all possible embodiments, and they are not intended to be exhaustive or limiting of the possible advantages which can be realized. Thus, these and other objects and advantages of various exemplary embodiments will be apparent from the description herein or can be learned from practicing various exemplary embodiments, both as embodied herein or as modified in view of any variation which may be apparent to those skilled in the art. Accordingly, the present invention resides in the novel methods, arrangements, combinations and improvements herein shown and described in various exemplary embodiments.

SUMMARY OF THE INVENTION

In light of the present need for a glitch-free clock regeneration circuit, a brief summary of various exemplary embodiments is presented. Some simplifications and omission may be made in the following summary, which is intended to highlight and introduce some aspects of various exemplary embodiments, but not intended to limit the scope of the invention.

When an NT card is physically removed from a redundant IP/ATM DSLAM system, the clock source it was providing is often subjected to an undesirable glitching that affects the input of the NT remaining in the system. As referred to herein, a "glitch" or "glitching" means false or spurious events in an electronic signal. Sometimes interface logic exists that is designed to address protocol violations and/or data errors on the synchronous interface. Typically, this interface logic assumes that the clock is healthy or otherwise free of glitches. Consequently, the presence of a glitch in the clock input can result in unreliable behavior in the NT card or cards that were not removed physically from the system. This undesirable behavior of the remaining NT card(s) may even give rise to the level of an unrecoverable lock up condition in the system. An unrecoverable lock up condition in the system often requires the NT to be reset in order for proper operation to resume.

A similar problem exists when two blocks with independent resets interface synchronously. Sometimes these two blocks are on the same card. If the reset of one of the blocks asynchronously affects the clock to the system, the problems described above can also result for these reasons.

The problems described above are issues of unreliable clock sources. In various exemplary embodiments, unreliable clock source issues are resolved by passing an incoming clock signal through a phase lock loop (PLL). Passing an incoming clock through a PLL results in a "clean" clock signal on the receiving side of the synchronous interface. However, if the clock source is lost, typically the PLL will lose its lock. An indication in such a system that the PLL lost its lock is used in various exemplary embodiments to reset the logic that is running on the clock from the PLL. In various exemplary embodiments, when the clock source is re-applied, the PLL correspondingly re-achieves a lock. In various exemplary embodiments, when the PLL re-achieves a lock, a reset is removed and the circuit continues normal operation.

The embodiments described above have associated problems. For example, FPGA vendors typically specify that once a PLL loses lock, a corresponding output clock is no longer reliable unless the PLL is reset prior to an attempt to re-achieve a lock. In various exemplary embodiments, the reset activity described above requires software intervention. A need for such software intervention is undesirable.

Another problem associated with the various embodiments described above is that PLL resources in FPGAs are not limitless. Thus, in some instances, the use of a PLL will not be available because all of the resources on a device are already in use. This problem is believed to be particularly prevalent in FPGA devices from low cost FPGA families.

Another problem associated with the various exemplary embodiments described above is that PLLs often have a minimum input frequency. Such a requirement creates problems when attempting to implement an embodiment with a low-speed clock.

In various exemplary embodiments, an asynchronous stable clock source is used to perform regeneration of an incoming clock wherein the incoming clock contains glitches and the regenerated clock does not contain glitches. In various exemplary embodiments, such an asynchronous stable clock source is used in a synchronous interface. In various exemplary embodiments, an asynchronous stable clock source is used to regenerate an input clock to an FPGA or ASIC wherein the clock is sourced off-board or from an otherwise unreliable clock source. Thus, in various exemplary embodiments, an asynchronous stable clock source is implemented in a system where ATM traffic passes between two redundant NTs and a DSLAM using a Utopia L2 interface.

Accordingly, a clock regeneration circuit is provided that is free from glitches. The implementation of a synchronous clock for external interfaces subject to clock instability is beneficial when the synchronous clock does not contain glitches. Thus, in various exemplary embodiments, a clock is provided that is synchronous to an incoming clock source that contains glitches.

In various exemplary embodiments, an output clock source and synchronous interface signals are directly fed into an off-the-shelf interface IP core. In various exemplary embodiments, this is achieved because an interface protocol is maintained.

In various exemplary embodiments, the implementation of the clock regeneration circuit that is free of glitches is advantageous over other DSLAMs because it facilitates the use of synchronous interfaces across inter-PCB (Printed Circuit Board) interfaces or interfaces straddling reset boundaries. In such applications, the synchronous interface's clock often becomes unreliable. In various exemplary embodiments, a clock regeneration circuit free of glitches is combined with various embodiments of zero clock delay meta-stability filters. In various exemplary embodiments, such circuits provide a complete meta-stability protection solution for inter-PCB synchronous interfaces.

In various exemplary embodiments, where DSLAMs that do not include clock regeneration protection that is free of glitches on synchronous interfaces that cross PCB boundaries suffer from problems because a reset, extraction or insertion occurs on the block or PCB containing the clock source for the synchronous interface, the other block or PCB on the synchronous interface also requires a reset before proper operation is able to resume.

It should be apparent to those having an ordinary skill in the art that various exemplary embodiments are not implemented in DSLAMs. Rather, the subject matter described above and below is implemented in various exemplary embodiments in any form of a product that includes a synchronous interface.

Accordingly, various exemplary embodiments include clock regeneration circuits that do not contain glitches. Likewise, various exemplary embodiments include a method to prevent a meta-stability event on a synchronous interface where the event results from a manual extraction or insertion of a PCB in a system resulting in a clock instability.

BRIEF DESCRIPTION OF THE DRAWINGS

In order to better understand various exemplary embodiments, reference is made to the accompanying drawings, wherein.

DETAILED DESCRIPTION OF THE PREFERRED EMBODIMENTS OF THE INVENTION

Figure 1:
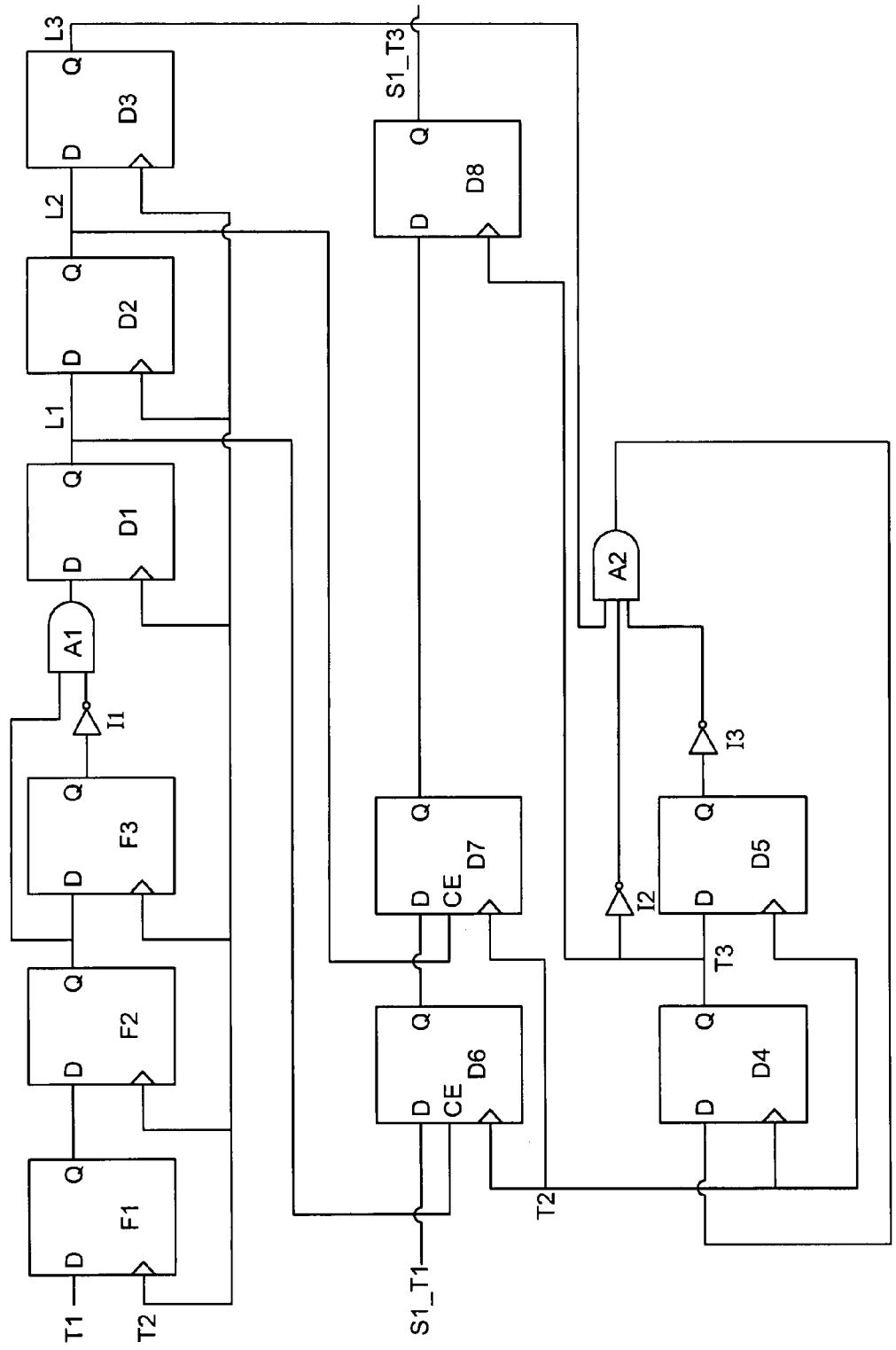
FIG. 1 is a schematic diagram showing electrical components and connections between electrical components in an exemplary embodiment of a clock regeneration circuit that is free of glitches.
Figure 2:
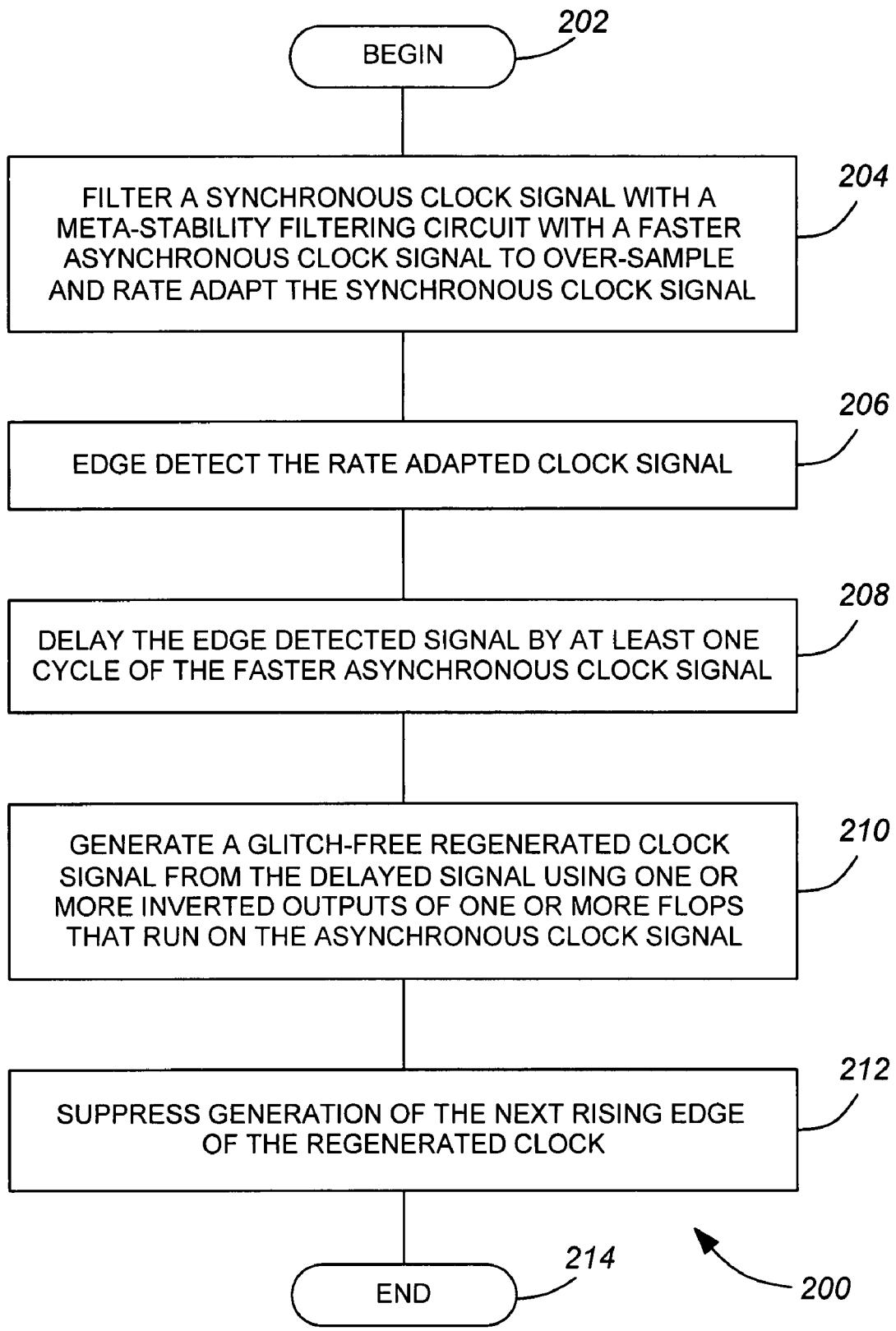
FIG. 2 is a flow chart of an exemplary embodiment of a method of generating the clock that is free of glitches.
Figure 3:
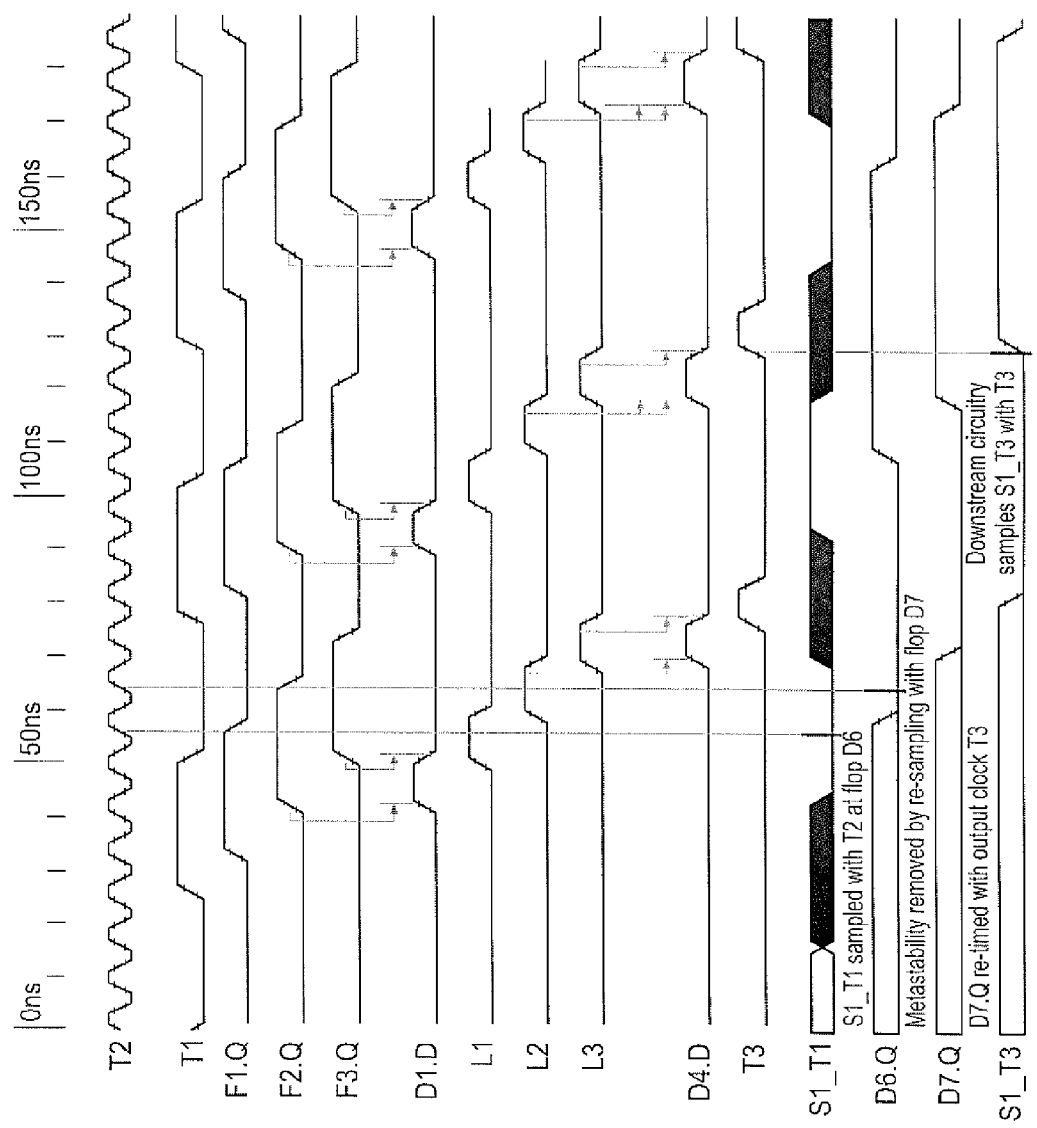

FIG. 1 is a schematic diagram showing electrical components and connections between electrical components in an exemplary embodiment of a clock regeneration circuit that is free of glitches;

FIG. 2 is a flow chart of an exemplary embodiment of a method of generating the clock that is free of glitches; and FIG. 3 is an exemplary timing diagram for the clock regeneration circuit of FIG. 1.

In various exemplary embodiments, asynchronous clock signal T2 has a frequency much higher than synchronous clock signal T1. In this initial stage of exemplary clock regeneration circuit 100, synchronous clock signal T1, which is associated with the interface, is over-sampled and rate adapted through the meta-stability filtering circuit consisting of flops F1, F2 to asynchronous clock signal T2. This over-sampling of synchronous clock T1 is achieved by taking multiple samples of synchronous clock signal T1 before synchronous clock signal T1 is able to transition and repeat. In various exemplary embodiments, the rate adaption of synchronous clock T1 eliminates meta-stability events from synchronous clock T1 by filtering such meta-stability events out of incoming synchronous clock signal T1.

Following the meta-stability filtering circuit with flops F1, F2, flop F3 in combination with inverter I1 and and-gate A1 edge detect the rate adapted clock signal output from the meta-stability filtering circuit. In the embodiment of exemplary clock regeneration circuit 100, the rising edge of the rate adapted clock signal is edge detected by the edge detection circuit consisting of flop F3, inverter I1 and and-gate A1.

In various exemplary embodiments, asynchronous clock signal T2 has a frequency much higher than synchronous clock signal T1, as depicted in the timing diagram of FIG. 3. In this initial stage of exemplary clock regeneration circuit 100, synchronous clock signal T1, which is associated with the interface, is over-sampled and re-timed through the meta-stability filtering circuit consisting of flops F1, F2 to asynchronous clock signal T2. This over-sampling of synchronous clock T1 is achieved by taking multiple samples of synchronous clock signal T1 before synchronous clock signal T1 is able to transition and repeat. In various exemplary embodiments, the re-timing of synchronous clock T1 eliminates meta-stability events from synchronous clock T1 by filtering such meta-stability events out of incoming synchronous clock signal T1.

Following the meta-stability filtering circuit with flops F1, F2, flop F3 in combination with inverter I1 and and-gate A1 edge detect the re-timed clock signal output from the meta-stability filtering circuit. In the embodiment of exemplary clock regeneration circuit 100, the rising edge of the rate adapted clock signal is edge detected by the edge detection circuit consisting of flop F3, inverter I1 and and-gate A1.

Exemplary clock regeneration circuit 100 further includes a clock regeneration stage at and-gate A2. In exemplary clock regeneration circuit 100, and-gate A2 has three inputs coming respectively from the outputs of flops D3, D4 (inverted at inverter I2) and flop D5 (inverted at inverter I3). The output of and-gate A2 thus constitutes a regenerated clock signal that is free of glitches that may be present in input clock signal T1.

As is evident in exemplary clock regeneration circuit 100, the higher frequency asynchronous clock signal T2 is also used as the clock signal for flops D4, D5, D6, D7. The inverted output signals from flops D4 and D5 that are input to and-gate A2 prevent the output from and-gate A2 from becoming active for two clock cycles of higher frequency asynchronous clock signal T2 after it has already gone active. Consequently, in various exemplary embodiments, at least three clock cycles of higher frequency asynchronous clock T2 must pass for each cycle of the regenerated clock signal T3.

Incidentally, the output of the and-gate A2 is an advanced version of regenerated clock signal T3. Under normal operation, when synchronous clock signal T1 is a valid clock signal, the period of regenerated clock signal T3 will follow the period of synchronous clock signal T1.

The ultimate output of exemplary clock regeneration circuit 100 is regenerated clock signal T3 that is free from glitches and is synchronous to the incoming interface with the timing that is known relative to the interface and guaranteed to having an absolute maximum frequency of one-third the frequency of asynchronous clock signal T2. Regenerated clock signal T3 free of glitches is used in various exemplary embodiments to clock logic using input signals from the synchronous interface and to clock signals towards the synchronous interface without fear of having an unnecessarily short clock cycle that results in violating internal logic timing. Such violations of internal logic timing often result in functional failures of the device. Such meta-stability events are filtered by the regenerated clock signal T3 that is free of glitches.

Flops D4 and D5 have no effect on the output of and-gate A2 except to filter undesired glitches in synchronous clock signal T1. Absent the presence of undesirable glitches in synchronous clock signal T1, the output of and-gate A2 follows clock signal T1. The output of and-gate A2 does not have the same duty cycle as asynchronous clock signal T2. In other words, the output of and-gate A2 is only high for one clock cycle of asynchronous clock signal T2 and is low until the next rising edge of synchronous clock signal T1 causes and-gate A2 to again become high for a single clock cycle of asynchronous clock signal T2.

In various exemplary embodiments, exemplary clock regeneration circuit 100 is combined with a zero clock delay meta-stability circuit by including flops D1, D2, D3, D6, D7 and D8. Such embodiments achieve a synchronous interface that is protected against meta-stability events caused either by changes on the synchronous inputs or by glitching of the input clock.

According to the foregoing, flop D8 is the first register that runs on the re-generated clock. Flop D8 runs on the re-generated clock synchronously. Thus, S1_T3 is an output signal synchronous to T3. Similarly, input signal S1_T1 to flop D6 is an input signal synchronous to clock signal T1. In various exemplary embodiments, S1_T1 represents a bus of synchronous signals. Flops D6 and D7 are clock enabled (CE).

In various exemplary embodiments, the purpose and operation of flops D6, D7 and D8 are as follows. Flops D6 and D7 form a meta-stability filter for a synchronous bus of signals S1_T1. In various exemplary embodiments, flop D6 is omitted and flop D8 provides the second half of the meta-stability filter. In various exemplary embodiments, the purpose of flop D8 is to finally re-time the synchronous signals to the new regenerated clock domain.

In various exemplary embodiments, the clock regeneration circuit 100 is implemented within a device containing downstream receiving logic. In various exemplary embodiments, clock regeneration circuit 100 is implemented external to a device containing downstream receiving logic. It is believed that embodiments where clock regeneration circuit 100 is implemented external to a device containing downstream receiving logic are beneficial in cases where the receiving logic is implemented in a device that is off-the-shelf such as off-the-shelf ASIC.

The use of flop stages D4 and D5, along with inverters I2 and I3 control the maximum frequency for the re-generated clock, T3, in the event of glitching on the input clock T1. Specifically, the maximum frequency of regenerated clock T3 equals (1/(N+1))*the frequency of T2, where N is the number of such stages and is greater than zero. Thus, according to the exemplary embodiment depicted in FIG. 1, N=2 and the maximum frequency of T3 is ⅓rd the frequency of T2. According to the foregoing, it should be noted that, where N=0, the maximum frequency of T3 is ½ of the frequency of T2.

In another example, T2 is a 100 MHz clock signal and operational specifications for a receiving circuit recommend that the receiving circuit operate at a frequency equal to, or less than, 30 MHz. In this example, it would be desirable to use at least 3 stages (N=3) in an embodiment designed for such a use. This is true because such an embodiment would have a frequency for T3 of no greater than 25 MHz, which is equal to or less than the 30 MHz desired for the end receiving logic in this exemplary use.

The ability to control the maximum frequency of T3 is believed to be a beneficial design characteristic to consider when choosing between various exemplary embodiments when it is desirable to prevent the frequency of T3 from exceeding a maximum operating frequency of a device receiving the regenerated clock and the signals from the interface synchronous with T1, such as S1_T1, that have been re-synchronized to T3, such as S1_T3.

Based on the foregoing, it should be apparent that, in various exemplary embodiments, any additional combination of flop and inverter stages which feedback into A2 in a manner similar to the structure disclosed FIG. 1 are implemented. Similarly, according to the foregoing, it should be apparent that various exemplary embodiments include fewer flop and inverter stages that feedback into A2 than flop stages D4 and D5, along with inverters I2 and I3, depicted in FIG. 1.

FIG. 2 is a flow chart of an exemplary method 200 of generating a regenerated clock signal that is free of glitches. Exemplary method 200 begins in step 202. Following exemplary step 202, the method passes to exemplary step 204. In exemplary step 204, asynchronous clock signal is filtered with a meta-stability filtering circuit having a faster asynchronous clock signal. As described elsewhere herein, in various exemplary embodiments, an asynchronous clock is used to perform meta-stability filtering. In exemplary step 204 the result is an over-sampled and rate adapted synchronous clock signal.

Exemplary method 200 then passes to exemplary step 206. In exemplary step 206, the rate adapted clock signal is edge detected. In various exemplary embodiments, the rising edge of the rate adapted clock signal is edge detected in exemplary step 206. Exemplary method 200 then passes to exemplary step 208. However, it should be noted that various exemplary embodiments exclude step 208.

FIG. 2 is a flow chart of an exemplary method 200 of generating a regenerated clock signal that is free of glitches. Exemplary method 200 begins in step 202. Following exemplary step 202, the method passes to exemplary step 204. In exemplary step 204, asynchronous clock signal is filtered with a meta-stability filtering circuit having a faster asynchronous clock signal. As described elsewhere herein, in various exemplary embodiments, an asynchronous clock is used to perform meta-stability filtering. In exemplary step 204 the result is an over-sampled and re-timed synchronous clock signal.

Exemplary method 200 then passes to exemplary step 206. In exemplary step 206, the re-timed clock signal is edge detected. In various exemplary embodiments, the rising edge of the re-timed clock signal is edge detected in exemplary step 206. Exemplary method 200 then passes to exemplary step 208. However, it should be noted that various exemplary embodiments exclude step 208.

In exemplary step 212 generation of the next rising edge of the regenerated clock signal is suppressed. In various exemplary embodiments, the suppression lasts for a predetermined number of clock cycles of the asynchronous clock. In various exemplary embodiments the suppression is implemented by using the predetermined number of inverted outputs of a predetermined number of flops that also run on the asynchronous clock signal. Some such embodiments ensure the maximum operating frequency of the receiving logic is not exceeded as the result of a "glitch" on T1 resulting in a short period clock, also known as a runt period clock, event on T3. Greater detail of a particular exemplary embodiment of a circuit implementing one or more of the foregoing features is described herein in connection with FIG. 1. The exemplary method 200 then passes to step 214 where the method 200 ends.

According to the foregoing, various exemplary embodiments of a method of generating a regenerated clock signal are achieved using any of the various exemplary embodiments of a clock regeneration circuit described herein. It should be apparent to those having an ordinary level of skill in the art that various exemplary embodiments of the method of generating a regenerated clock signal vary based on the variances described herein in connection with the various exemplary embodiments of a clock regeneration circuit.

Although the various exemplary embodiments have been described in detail with particular reference to certain exemplary aspects thereof, it should be understood that other embodiments exist including combinations of various aspects described in connection with different embodiments or figures, and the details are capable of modifications in various obvious respects. As is readily apparent to those skilled in the art, variations and modifications can be affected while remaining within the spirit and scope of the disclosure. Accordingly, the foregoing disclosure, description, and figures are for illustrative purposes only, and do not in any way limit the invention, which is defined only by the claims.

FIG. 3 is an exemplary timing diagram for the clock regeneration circuit of FIG. 1. The first two rows depict asynchronous clock signal T2 and synchronous clock signal T1. The next three rows depict waveforms at the "Q" terminals of flip flops F1, F2, and F3. The next set of four rows depicts the waveform input to terminal "D" of flip flop D1 and the waveforms at the "Q" terminals of flip flops D1, D2, and D3. The final set of six rows depicts the waveform input to terminal "D" of flip flop D4, the regenerated clock signal T3, input signal S1_T1, waveforms at the "Q" terminals of flip flops D6 and D7, and output signal S1_T3.

What is claimed is:

1. A clock regeneration circuit, comprising:
    an asynchronous clock signal input to a first meta-stability filtering circuit, the first meta-stability filtering circuit including first and second filtering flip flops;
    a first synchronous clock signal input to the first meta-stability filtering circuit, the first synchronous clock signal having a frequency lower than the asynchronous clock signal, the first synchronous clock signal being over-sampled and re-timed to the asynchronous clock signal by the first meta-stability filtering circuit to produce an over-sampled and re-timed output of the first meta-stability filtering circuit;
    a second meta-stability filtering circuit, the second meta-stability filtering circuit including third and fourth filtering flip flops that are clocked by the asynchronous clock signal, and receiving an input that is synchronous to the first synchronous clock signal;
    an edge detector circuit including an edge detecting flip-flop, an inverter, and a first and-gate, the edge detector circuit edge detecting an edge of the output of the first meta-stability filtering circuit, the edge detector circuit producing an edge-detected output;
    a delay circuit including at least one delay flip flop, the delay circuit receiving the edge-detected output, and each delay flip flop in the delay circuit producing a respectively delayed output;
    a first regeneration flip flop that is clocked by the asynchronous clock signal, the first regeneration flip flop having an output that is a second synchronous clock signal;
    a second regeneration flip flop that is clocked by the asynchronous clock signal and receives an input that is the second synchronous clock signal; and
    a clock regeneration stage including a second and-gate, the clock regeneration stage receiving an input from a last flip flop in the delay circuit, and inputs that are inverted output signals from the first regeneration flip-flop and the second regeneration flip-flop, the output of the clock regeneration stage being an input to the first regeneration flip flop.

2. The clock regeneration circuit of claim 1, wherein the first meta-stability filtering circuit filters meta-stability events out of the first synchronous clock signal.

3. The clock regeneration circuit of claim 1, wherein the edge detector circuit edge detects a rising edge of the output of the first meta-stability filtering circuit.

4. The clock regeneration circuit of claim 1, wherein the delay circuit includes at least three delay flip flops.

5. The clock regeneration circuit of claim 1, wherein the first synchronous clock signal has a glitch and the second synchronous clock signal does not have a glitch.

6. The clock regeneration circuit of claim 5, wherein the second synchronous clock signal is synchronous to an incoming interface.

7. The clock regeneration circuit of claim 6, wherein the second synchronous clock signal has an absolute maximum frequency that is one-third the frequency of the asynchronous clock signal.

8. The clock regeneration circuit of claim 1, wherein at least three cycles of the asynchronous clock signal pass for each cycle of the second synchronous clock signal.

9. The clock regeneration circuit of claim 1, wherein the clock regeneration circuit is implemented external to a device containing downstream receiving logic.

10. A clock regeneration circuit, comprising:
    an asynchronous clock signal input to a first meta-stability filtering circuit, the meta-stability filtering circuit including first and second filtering flip flops;
    a first synchronous clock signal input to the first meta-stability filtering circuit, the first synchronous clock signal having a frequency lower than the asynchronous clock signal, the first synchronous clock signal being over-sampled and re-timed to the asynchronous clock signal by the meta-stability filtering circuit to produce an over-sampled and re-timed output of the meta-stability filtering circuit;
    a second meta-stability filtering circuit, the second meta-stability filtering circuit including third and fourth filtering flip flops clocked by the asynchronous clock signal and receiving an input that is synchronous to the first synchronous clock signal;
    an edge detector circuit including an edge detecting flip-flop, an inverter, and a first and-gate, the edge detector circuit edge detecting an edge of the output of the first meta-stability filtering circuit, the edge detector circuit producing an edge-detected output;
    at least one regeneration flip-flop that is clocked by the asynchronous clock signal and has an output that is a second synchronous clock signal; and
    a clock regeneration stage including a second and-gate, the clock regeneration stage receiving an input that is the edge-detected output, at least one input that is an inverted output of the at least one regeneration flip-flop, an output of the clock regeneration stage being an input to the at least one regeneration flip-flop.

11. A method of generating a regenerated clock signal, comprising:
    filtering a first synchronous clock signal with a first meta-stability filtering circuit, the first meta-stability filtering circuit including first and second filtering flip flops, to a higher asynchronous clock signal to over-sample and re-time the first synchronous clock signal, thus producing a re-timed signal;
    edge-detecting the re-timed signal, thus producing an edge-detected signal;
    filtering the edge-detected signal with a second meta-stability filtering circuit, the second meta-stability filtering circuit including third and fourth filtering flip flops that are clocked by the asynchronous clock signal and receiving an input that is synchronous to the first synchronous clock signal; and generating the regenerated clock signal from the filtered and edge-detected signal.

12. The method of claim 11, wherein the edge-detected signal is a rising edge-detected signal.

13. The method of claim 11, wherein the synchronous clock signal has a glitch and the regenerated clock signal does not have a glitch.

14. The method of claim 11, wherein generating the regenerated clock signal uses two inverted output signals from two flip-flops that run on the asynchronous clock signal.

15. The method of claim 11, wherein the regenerated clock signal has an absolute maximum frequency that is one-third the frequency of the asynchronous clock signal.

16. The method of claim 11, further comprising:
delaying the edge-detected signal by at least one clock cycle of the asynchronous clock.

17. The method of claim 11, wherein the regenerated clock signal is synchronous.

* * * * *